(12) United States Patent
Ice et al.

(10) Patent No.: US 7,503,112 B2
(45) Date of Patent: Mar. 17, 2009

(54) METHODS FOR MANUFACTURING LEAD FRAME CONNECTORS FOR OPTICAL TRANSCEIVER MODULES

(75) Inventors: Donald A. Ice, Milpitas, CA (US); Darin James Douma, Monrovia, CA (US)

(73) Assignee: Finisar Corporation, Sunnyvale, CA (US)

( * ) Notice: Subject to any disclaimer, the term of this patent is extended or adjusted under 35 U.S.C. 154(b) by 382 days.

(21) Appl. No.: 11/066,030

(22) Filed: Feb. 25, 2005

(65) Prior Publication Data
US 2005/0232641 A1 Oct. 20, 2005

Related U.S. Application Data

(63) Continuation-in-part of application No. 10/810,041, filed on Mar. 26, 2004, now Pat. No. 7,370,414.

(60) Provisional application No. 60/548,257, filed on Feb. 27, 2004.

(51) Int. Cl.
*H01R 43/00* (2006.01)

(52) U.S. Cl. ............................ 29/883; 29/882; 29/884; 29/874; 29/827; 439/79

(58) Field of Classification Search ................ 29/825, 29/827, 829, 874, 882–884, 832, 834; 174/71 C, 174/84 C; 439/736, 660
See application file for complete search history.

(56) References Cited

U.S. PATENT DOCUMENTS

| 4,021,095 A | * | 5/1977 | Kinkaid et al. ............... 439/885 |
| 4,471,158 A | | 9/1984 | Roberts |
| 4,547,964 A | * | 10/1985 | Amano et al. .................. 29/883 |
| 4,593,463 A | | 6/1986 | Kamono |
| 4,689,023 A | | 8/1987 | Strong et al. |
| 4,846,701 A | * | 7/1989 | Hayes et al. ............ 439/620.15 |
| 5,219,305 A | | 6/1993 | Kawaguchi et al. |

(Continued)

OTHER PUBLICATIONS

U.S. Appl. No. 11/066,056, filed Feb. 25, 2005 entitled "Methods for Manufacturing Optical Modules Using Lead Frame Connectors."

(Continued)

*Primary Examiner*—Minh Trinh
(74) *Attorney, Agent, or Firm*—Workman Nydegger

(57) ABSTRACT

Methods of manufacturing lead frame connectors for use in connecting optical sub-assemblies to printed circuit boards in optical transceiver modules are disclosed. The lead frame connectors are formed by first stamping a selected configuration of conductors in a conductive ribbon. Each of the conductors can then be secured in a fixed position with respect to each other. A casing having a first part and a second part can then be molded about the conductors such that each of the conductors forms an electrical contact restrained in a fixed position with respect to the first part and a contact point extending from the second part. The conductors can be bent into any desired position to allow the electrical contacts to be connected to the optical sub assembly and the contact points to be connected to the printed circuit board.

14 Claims, 9 Drawing Sheets

U.S. PATENT DOCUMENTS

| | | |
|---|---|---|
| 5,286,221 A | 2/1994 | Fencl et al. |
| 5,295,214 A * | 3/1994 | Card et al. ............... 385/92 |
| 5,340,334 A | 8/1994 | Nguyen |
| 5,613,880 A | 3/1997 | Wang |
| 5,619,794 A | 4/1997 | Hokazono |
| 5,632,630 A | 5/1997 | Card |
| 5,663,526 A | 9/1997 | Card et al. |
| 5,742,480 A | 4/1998 | Sawada |
| 5,768,777 A * | 6/1998 | Lemke ................ 29/882 |
| 5,802,711 A | 9/1998 | Card et al. |
| 6,010,370 A * | 1/2000 | Aihara et al. ............ 439/660 |
| 6,068,523 A | 5/2000 | Takahashi |
| 6,086,413 A | 7/2000 | Karasik et al. |
| 6,125,535 A * | 10/2000 | Chiou et al. ............... 29/883 |
| 6,368,158 B1 | 4/2002 | Kan |
| 6,454,618 B1 | 9/2002 | Andoh |
| 6,488,534 B2 | 12/2002 | Soga |
| 6,527,571 B2 | 3/2003 | Muta |
| 6,588,100 B2 | 7/2003 | Ma et al. |
| 6,617,518 B2 | 9/2003 | Ames et al. |
| 6,652,294 B1 | 11/2003 | Zhang |
| 6,688,897 B2 | 2/2004 | Korsunsky |
| 6,762,119 B2 | 7/2004 | Ray et al. |
| 6,764,336 B2 | 7/2004 | Ma et al. |
| 6,764,338 B2 | 7/2004 | Feng |
| 6,796,852 B2 | 9/2004 | Okamoto |
| 6,817,782 B2 | 11/2004 | Togami et al. |
| 6,922,231 B1 | 7/2005 | Wang |
| 6,966,800 B2 | 11/2005 | Mott |
| 6,976,854 B2 | 12/2005 | Stockhaus et al. |
| 7,097,468 B2 | 8/2006 | Ice |
| 7,144,259 B2 | 12/2006 | Ice et al. |
| 7,229,295 B2 | 6/2007 | Ice et al. |
| 7,258,264 B2 | 8/2007 | Ice |
| 7,311,530 B2 * | 12/2007 | Ice et al. ................ 439/79 |
| 7,370,414 B2 | 5/2008 | Ice |
| 2002/0196996 A1 | 12/2002 | Ray |
| 2003/0026081 A1 | 2/2003 | Liu |
| 2003/0085054 A1 | 5/2003 | Ames |
| 2003/0180012 A1 * | 9/2003 | Deane et al. ............ 385/92 |
| 2005/0142685 A1 | 6/2005 | Ouellet |
| 2005/0154618 A1 | 7/2005 | Kita |
| 2005/0162761 A1 | 7/2005 | Hargis |
| 2005/0188535 A1 | 9/2005 | Ice |
| 2005/0191879 A1 | 9/2005 | Ice |
| 2005/0221637 A1 | 10/2005 | Ice et al. |
| 2005/0232641 A1 | 10/2005 | Ice et al. |
| 2006/0118807 A1 | 6/2006 | Ives et al. |
| 2006/0140554 A1 | 6/2006 | Oki |
| 2006/0252313 A1 | 11/2006 | Ice |
| 2006/0263013 A1 | 11/2006 | Sone |

OTHER PUBLICATIONS

U.S. Appl. No. 11/066,079, filed Feb. 25, 2005 entitled "Dual Segment Molded Lead Frame Connector for Optical Transceiver Modules."

* cited by examiner

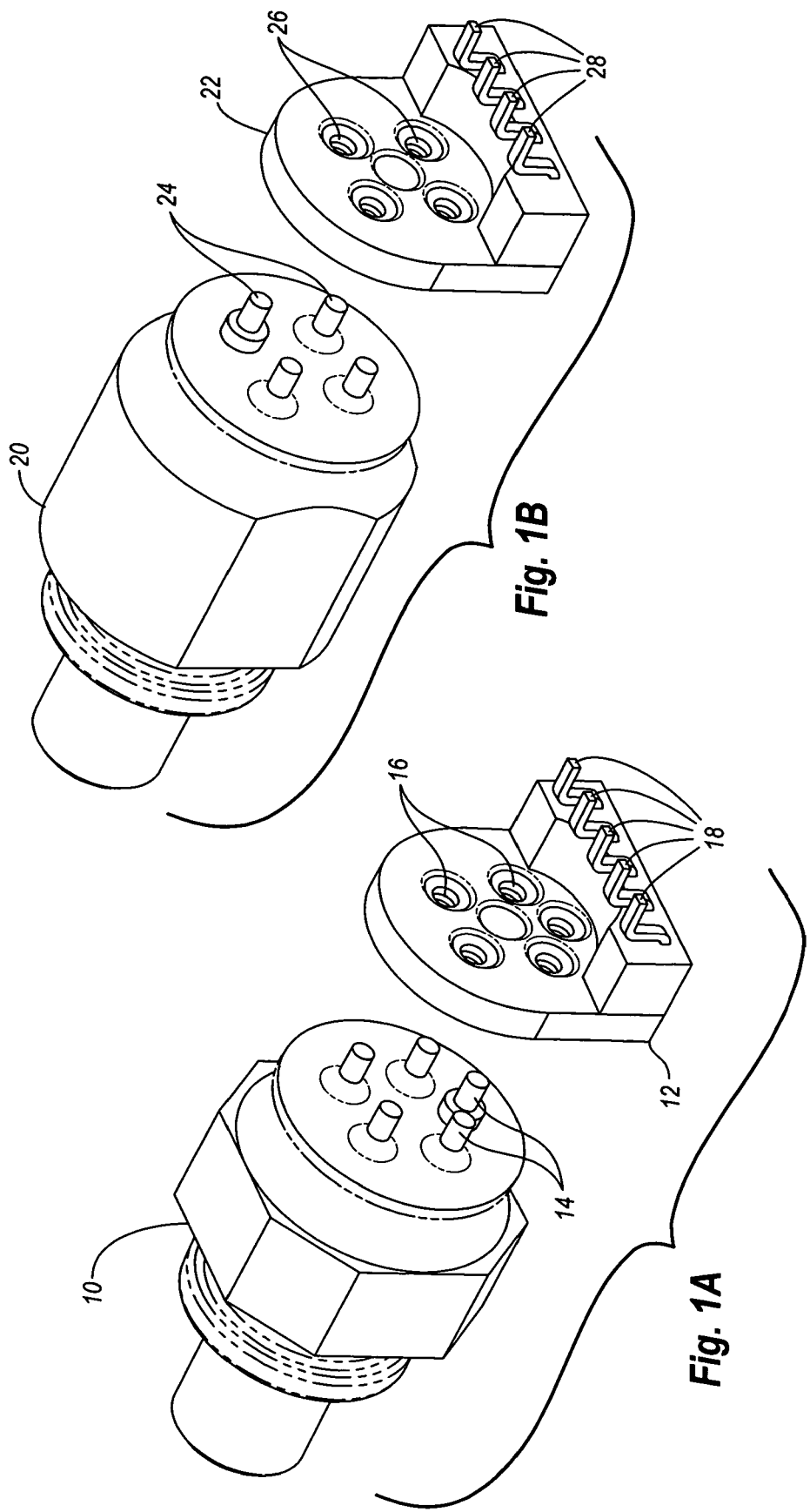

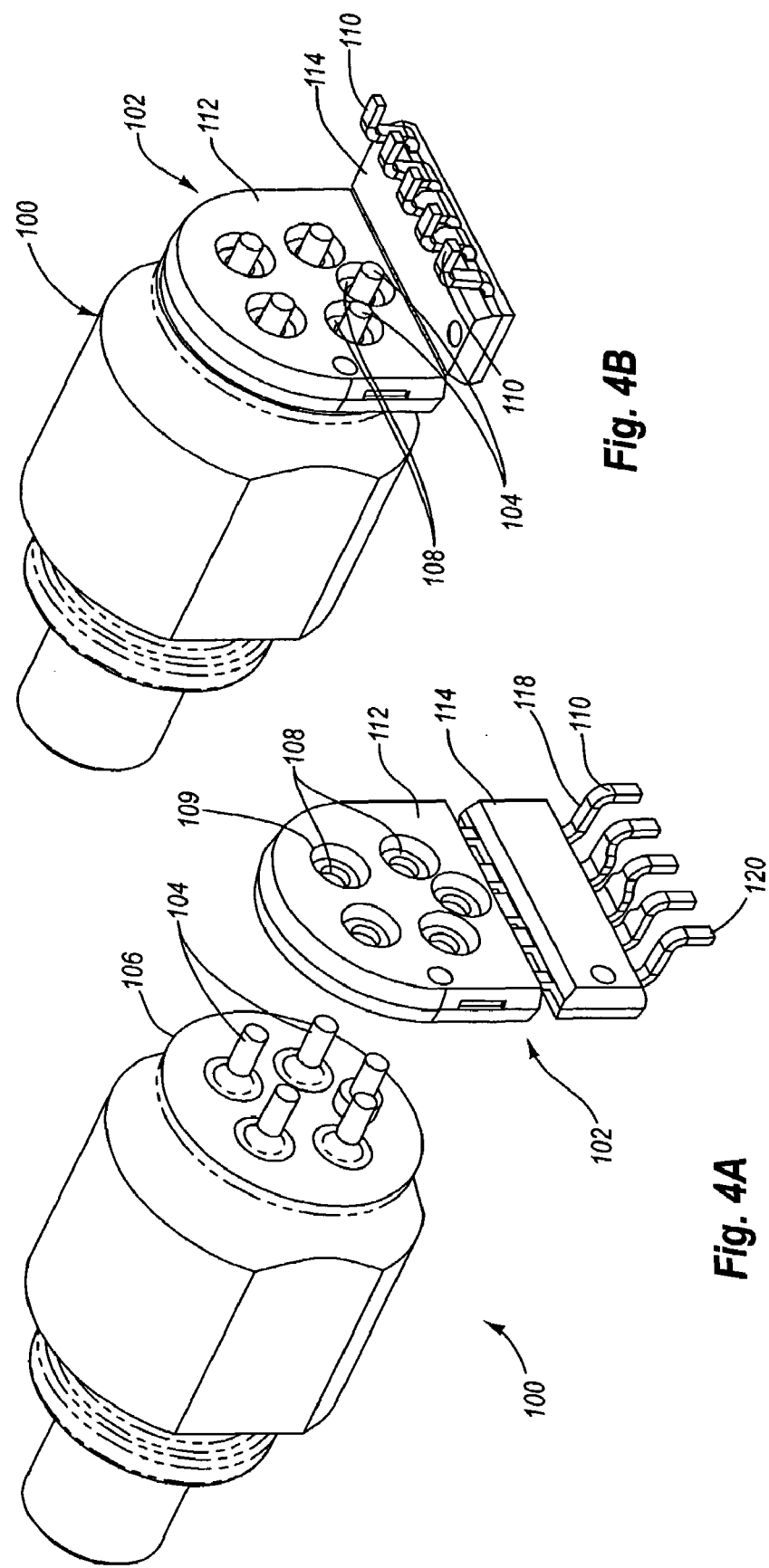

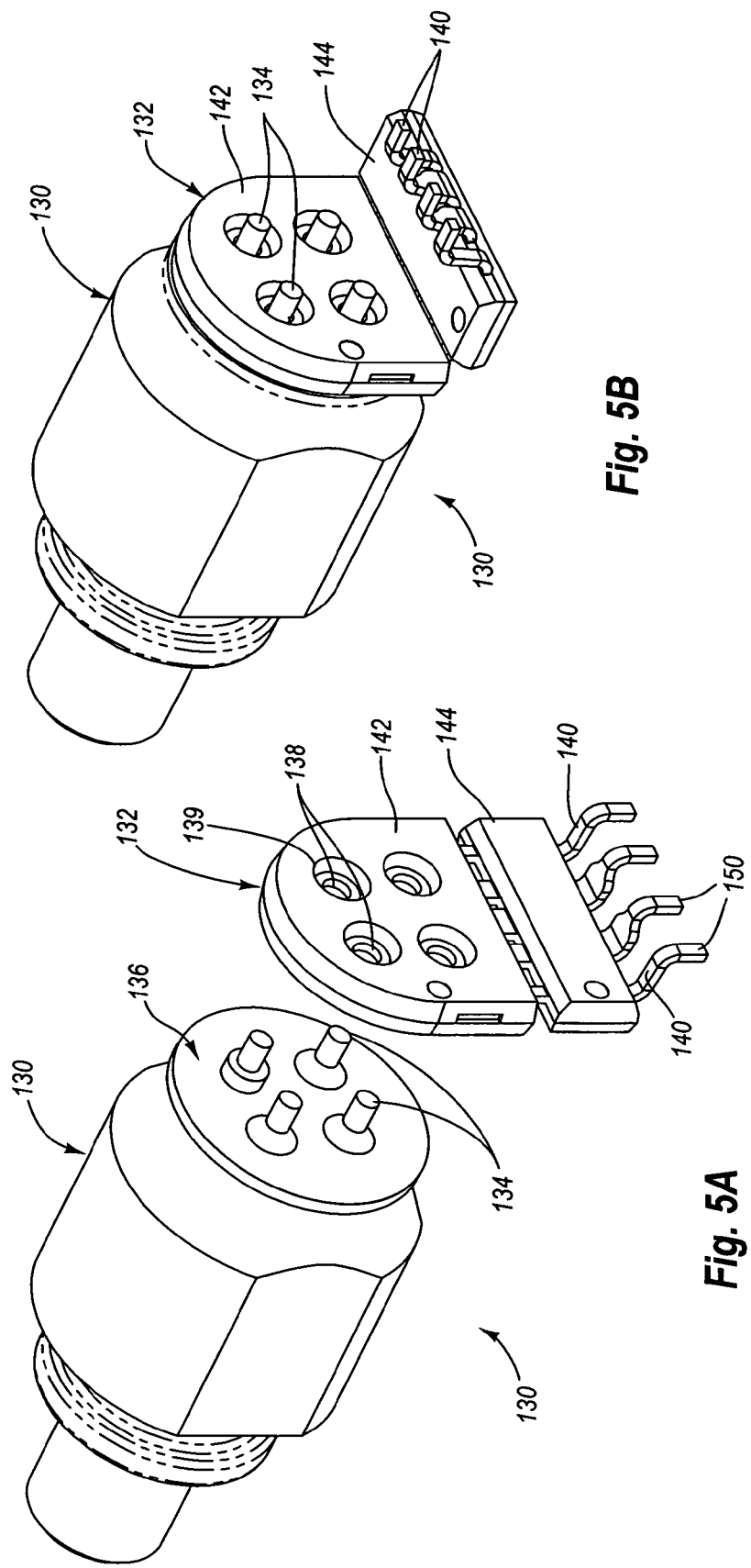

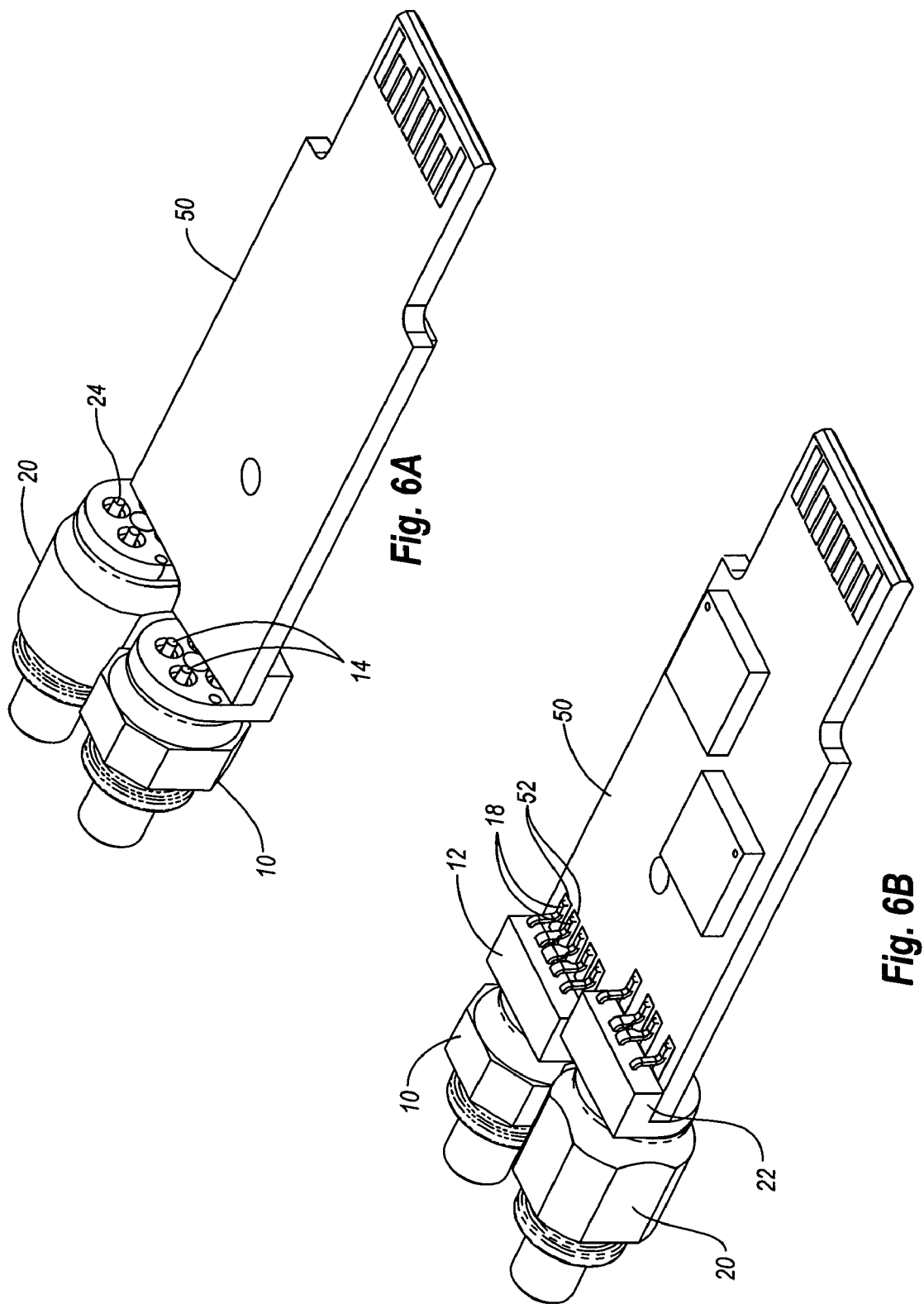

METHODS FOR MANUFACTURING LEAD FRAME CONNECTORS FOR OPTICAL TRANSCEIVER MODULES

RELATED APPLICATION

This application is a Continuation-in-Part application of U.S. patent application Ser. No. 10/810,041, filed on Mar. 26, 2004 now U.S. Pat. No. 7,370,414 and entitled "Methods for Manufacturing Lead Frame Connectors for Optical Transceiver Modules", which claims priority to and the benefit of U.S. Provisional Patent Application Ser. No. 60/548,257, filed Feb. 27, 2004 and entitled "Methods for Manufacturing Lead Frame Connectors for Optical Transceiver Modules", both of which are incorporated herein by reference in their entireties. This application is also related to U.S. patent application Ser. No. 10/809,992, filed on Mar. 26, 2004 and entitled "Lead Frame for Connecting Optical Sub-Assembly to Printed Circuit Board", which claims priority to and the benefit of U.S. Provisional Patent Application Ser. No. 60/548,846, filed Feb. 27, 2004, and entitled "Lead Frame for Connecting Optical Sub-Assembly to Printed Circuit Board" and U.S. patent application Ser. No. 10/810,040, filed on Mar. 26, 2004 and entitled "Methods for Manufacturing Optical Modules Using Lead Frame Connectors", which claims priority to and the benefit of U.S. Provisional Patent Application Ser. No. 60/548,485, filed Feb. 27, 2004 and entitled "Methods for Manufacturing Optical Modules Using Lead Frame Connectors", all of which are hereby incorporated by reference in their entireties.

BACKGROUND OF THE INVENTION

1. The Field of the Invention

The present invention relates generally to optical transceiver modules. More specifically, the present invention relates to dual-segment molded lead frame connectors used to connect an optical sub-assembly to a printed circuit board in an optical transceiver module.

2. Background and Relevant Art

Optical transceivers are used to transmit and receive optical signals from an optical network and to enable electrical network components to interface with and communicate over optical networks. Many optical transceivers are modular and are designed in accordance with industry standards that define mechanical aspects of the transceivers, form factors, optical and electrical requirements, and other characteristics and requirements of the transceivers. For example the Small Form-Factor Module Multi-Source Agreement (SFF MSA), the Small Form-Factor Pluggable Module Multi-Source Agreement (SFP MSA) and the 10 Gigabit Small Form Factor Pluggable Module Multi-Source Agreement (XFP MSA) Revision 3.1 define such standards. Each of these documents is incorporated herein by reference in their entireties.

The basic optical components of conventional transceivers include a transmitter optical sub-assembly (TOSA) and a receiver optical sub-assembly (ROSA). The TOSA receives electrical signals from a host device via circuitry of the transceiver module and generates a corresponding optical signal that is then transmitted to a remote node in an optical network. Conversely, the ROSA receives an incoming optical signal and outputs a corresponding electrical signal that can then be used or processed by the host device. Additionally, most transceivers include a rigid printed circuit board (PCB) containing, among other things, control circuitry for the TOSA and ROSA.

The connections between the optical sub-assemblies and the PCB in the transceiver module have various electrical and mechanical requirements. One of the most common electrical connection components used in conventional optical transceiver modules is a flexible printed circuit board, or "flex circuit," that connects the rigid printed circuit board of the module to leads associated with the TOSA or ROSA. Flex circuits have several advantages, including good electrical performance and radio frequency response. Advantageously, the flex circuits also have the ability to take up tolerances in the modules and to withstand stresses that arise during manufacture and operation of the modules.

While flex circuits have been widely used in recent years in optical transceiver modules, flex circuits represent a significant portion of the costs and labor required to manufacture transceiver modules. As the price of transceiver modules drops, the costs associated with flex circuits continue to represent an increasing proportion of the overall costs of transceiver modules. Due to the nature of flex circuits, the costs of producing flex circuits are generally higher than the cost of a PCB that performs the same functions.

Other approaches to connecting optical sub-assemblies to printed circuit boards have been introduced in recent years. For example, the leads protruding from TOSAs and ROSAs can be bent into a configuration that enables the leads to be directly soldered or otherwise connected to the printed circuit board. This technique is often less expensive than the use of flex circuits, but can lead to unfavorable radio frequency (RF) response due to the inability to carefully control impedances. In addition, bending the leads of TOSAs and ROSAs introduces reliability risks due to the likelihood of damaging glass seals or other fragile portions of the header assemblies in TOSAs and ROSAs that enclose the lasers and photodetectors, respectively.

Because of the possibility of damaging the TOSAs and ROSAs and poor electrical performance, bending the leads of the TOSAs and ROSAs to enable them to be directly connected to the printed circuit board is not suitable for many transceiver modules. This approach is particularly unsuitable for relatively high-speed transceiver modules, in which the RF response of the conductors is more important.

BRIEF SUMMARY OF THE EMBODIMENTS

Exemplary embodiments of the present invention relate to lead frame connectors that are used to electrically and mechanically connect optical sub-assemblies to printed circuit boards in optical transceiver modules. The lead frame connectors enable optical sub-assemblies to be connected to the printed circuit board in optical transceiver modules in a reliable and inexpensive manner, while maintaining desired radio frequency (RF) responses of the modules. The use of such lead frame connectors eliminates the need for flexible printed circuit boards that have been used in conventional transceiver modules.

According to one embodiment of the present invention, a stamped and bent conductive lead structure can be encased within two casings. The conductive lead structure and two casings can be coplanar during the molding process. This makes the creation of the tooling needed to produce the lead frame connectors much easier than prior designs. In one embodiment, the casings can be an insert injection molded plastic casings. The casings provide electrical insulation for the conductors in the lead frame as well as mechanical support for the finished component. The conductive lead structure of the lead frame connector connects to the leads associated with the optical sub-assemblies. In this embodiment, the two casings allow the conductive leads to be bent after the molding process. This facilitates easy surface mounting onto the printed circuit board to establish connectivity between the optical sub-assembly and the printed circuit board. The lead frame connectors can be adapted for use with transmitter optical sub-assemblies and receiver optical sub-assemblies, and can have any necessary number of leads.

According to one embodiment of the present invention, the lead frame connectors can be manufactured by stamping a selected configuration of conductors in a conductive ribbon. Each of the conductors can then be secured in a fixed position with respect to each other. A casing having a first part and a second part can then be molded about the conductors such that each of the conductors forms an electrical contact restrained in a fixed position with respect to the first part and a contact point extending from the second part. The conductors can be bent into any desired position to allow the lead frame connector to be connected to both the optical sub assembly and the printed circuit board.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 1A illustrates a perspective view of a ROSA and a corresponding lead frame connector that is constructed according to one exemplary embodiment the present invention;

FIG. 1B illustrates perspective view of a TOSA and a corresponding lead frame connector that is constructed according to an alternate embodiment of the invention;

FIG. 4A illustrates a perspective view of a ROSA and a corresponding lead frame connector that can be constructed according to an alternate exemplary embodiment of the present invention;

FIG. 4B illustrates a perspective view of the ROSA and lead frame connector of FIG. 4A in an assembled configuration;

FIG. 5A illustrates a perspective view of a TOSA and a corresponding lead frame connector that can be constructed according to an alternate exemplary embodiment of the present invention;

FIG. 5B illustrates a perspective view of the ROSA and lead frame connector of FIG. 5A in an assembled configuration ready for mounting;

FIGS. 6A and 6B are perspective views of opposite sides of a printed circuit board that has the lead frame connectors of FIGS. 1 and 2 attached thereto.

DETAILED DESCRIPTION OF THE EMBODIMENTS

Figure 2A:
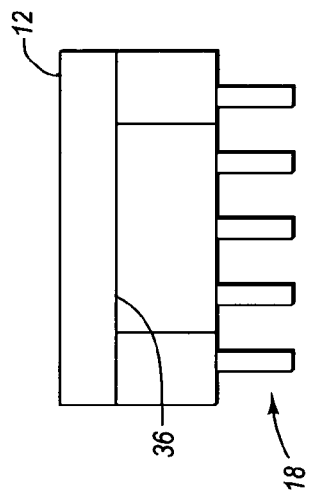
FIG. 2A illustrates a top view of the ROSA lead frame connector of FIG. 1A.

The present invention relates to lead frame connectors that are used to electrically and mechanically connect optical sub-assemblies to printed circuit boards in optical transceiver modules. According to one embodiment, the lead frame connector can include a preformed lead frame disposed with a casing or housing. The connector can be fabricated by molding a casing about the lead frame. In an alternate embodiment, the lead frame connector includes a two-piece casing about the lead frame or assembly. The lead frame or assembly can be mounted or disposed with the casing or housing while it lies in a single plane, thus making it easier to create the needed tooling and fabricate the lead frame connectors. The lead frame connectors of the present invention connect to the leads associated with the optical sub-assemblies. The lead frame connectors also can be surface mounted onto the printed circuit board to establish connectivity between the optical sub-assembly and the printed circuit board.

The lead frame connectors of the invention provide several advantages compared to the use of flex circuits or other conventional techniques. Compared to flex circuits, the lead frame connector components are significantly less expensive. In addition, the process of manufacturing a transceiver module using lead frame connectors can require less labor through increased automation. Compared to simply bending the leads of the optical sub-assemblies to permit direct connection to a PCB, the lead frame connectors have significantly better electrical performance and RF response. Moreover, there can be no significant risk of damaging the fragile portions of the optical sub-assemblies during the process of connecting the optical sub-assemblies to the PCB.

1. Lead Frame Connector Structure

FIG. 1A illustrates a ROSA 10 and a corresponding lead frame connector 12 that can be constructed according to an embodiment the invention. ROSAs typically have five leads 14, and the lead frame connector 12 of FIG. 1A has five corresponding electrical contacts 16. These contacts are electrically coupled to five corresponding conductors or leads 18. FIG. 1B illustrates a TOSA 20 and a corresponding lead frame connector 22 that can be constructed according to an embodiment of the invention. TOSAs typically have four leads 24, and the lead frame connector 22 of FIG. 1B has four corresponding electrical contacts 26. As with the lead frame connector 12 of FIG. 1A, the contacts 26 electrically couple to five corresponding conductors or leads 28. Although the lead frame connectors of FIGS. 1A and 1B are shown with four and five electrical contacts and leads, respectively, the principles of the invention disclosed herein can be applied to form lead frame connectors that have substantially any number of electrical contacts and/or leads.

Figure 2B:
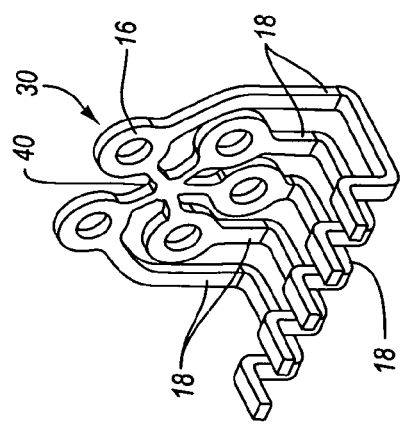
FIG. 2B illustrates a perspective view of the conductive leads in the lead frame of FIG. 1A.
Figure 2C:
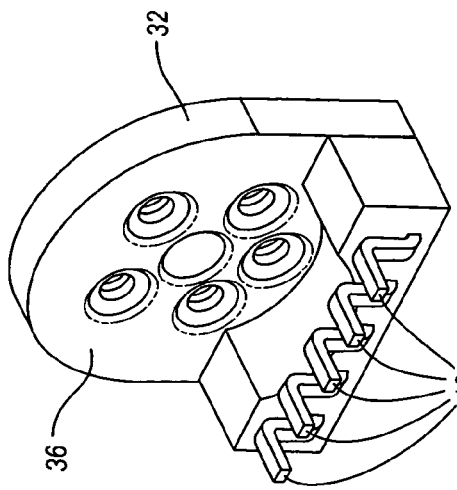
FIGS. 2C-2F illustrate various views of the ROSA lead frame connector of FIG. 1A.
Figure 2D:
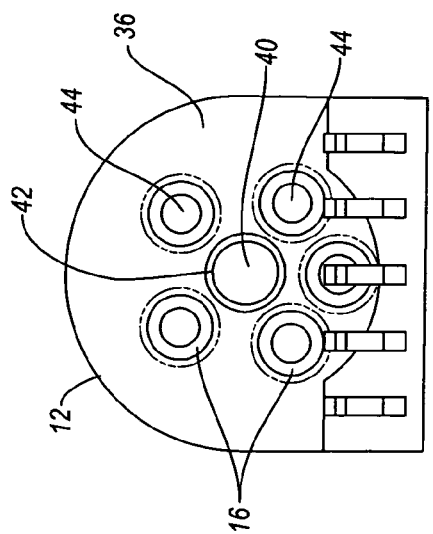
Figure 2E:
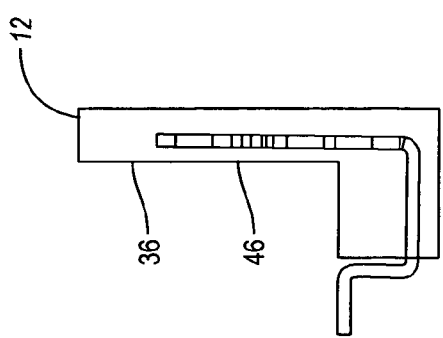
Figure 2F:
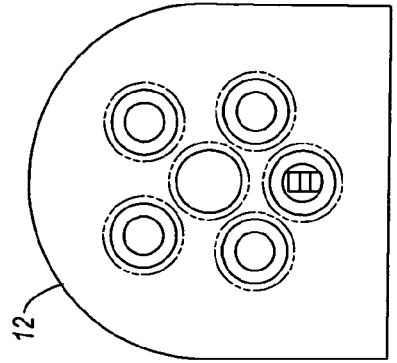

FIGS. 2A and 2C-2F show various views of the ROSA lead frame connector 12 of FIG. 1A. FIG. 2B illustrates a lead frame 30 without a casing 32 that can be disposed around the lead frame 30. The casing 32 provides electrical insulation for portions of the conductor or lead 18 of the lead frame 30, as well as mechanical support for the finished component. FIG. 2B illustrates the lead frame 30 in a condition prior to the five leads being electrically separated one from another, which is illustrated in FIGS. 1A and 1B, in a process that is described in greater detail below. FIGS. 3A-3F illustrate corresponding views of the TOSA lead frame connector 22 of FIG. 1B.

In FIGS. 2A-2F and 3A-3F, the electrically insulating casing 32 has a surface 36 that defines a plane. In the illustrated embodiment, the plurality of electrical contacts 16 are arrayed in a configuration that is substantially parallel to the plane defined by the casing 32. As also illustrated, the conductors or leads 18 extend from the contacts 16 and can be bent in three dimensions, such that, in the illustrated embodiment, at least a portion of the plurality of leads 18 extend out of the casing 32 in a direction that is not parallel to the plane defined by the casing 32. Of course, depending on the position of the optical sub-assemblies and the printed circuit board in any particular optical transceiver module, the conductors or leads 18 can be bent in any necessary orientation.

The lead frame connectors 12 and 22 of FIGS. 1A and 1B yield desirable electrical performance and RF response. These results can be achieved because of the ability to control impedances based on the fact that the width and shape of the conductors or leads 18 and the gaps between the conductors or leads 18 can be carefully controlled. The shape, position, and dimensions of the conductors or leads 18 in the lead frame connectors 12 and 22 can be selected based on the electrical and RF conditions that are to be experienced in any particular application. Prior to beginning the manufacturing process for lead frame connectors 12 and 22, computer simulations of various designs can be performed to identify those designs that generate acceptable RF responses. The material used to mold lead frame connectors 12 and 22 can be selected to have an appropriate dielectric constant as determined by this simulation process or, in the alternative, the dielectric constant can be used as an input to the simulation process. For instance, the material forming casing 12 and 22 can be polymers including, but not limited to, thermoplastics and thermoset materials, synthetic materials, or other materials capable of functioning as a dielectric or insulator. The electrical performance of the lead frame connectors 12 and 22 is particularly important for relatively high frequency transceiver modules, such as those that operate at 1, 2, 4, or as much as 10 Gigabits per second (Gbit/s) or higher. Exemplary embodiments of the lead frame connectors of the present invention can be used with any of these modules while exhibiting acceptable RF responses.

Figure 4C:
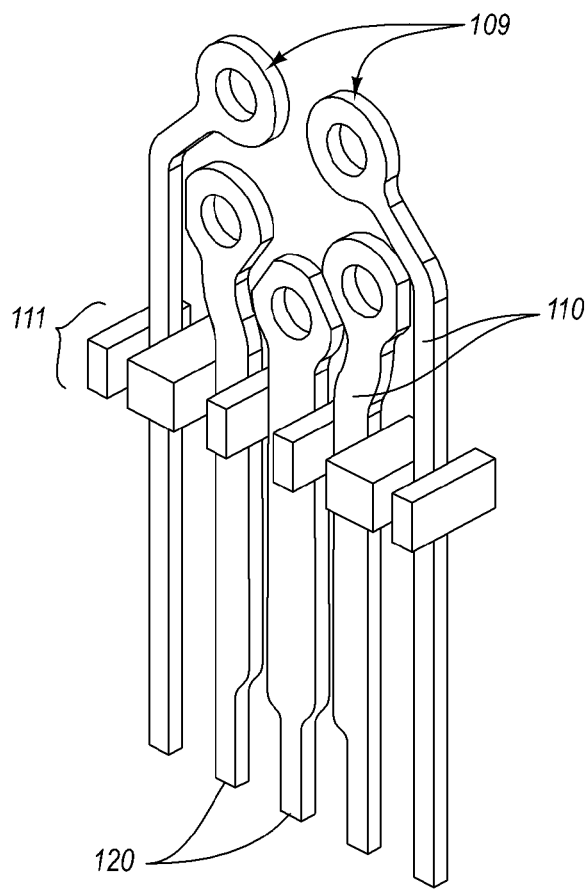
FIG. 4C illustrates a perspective view of the conductive leads in the lead frame of FIGS. 4A and 4B in an unbent configuration prior to molding.
Figure 4D:
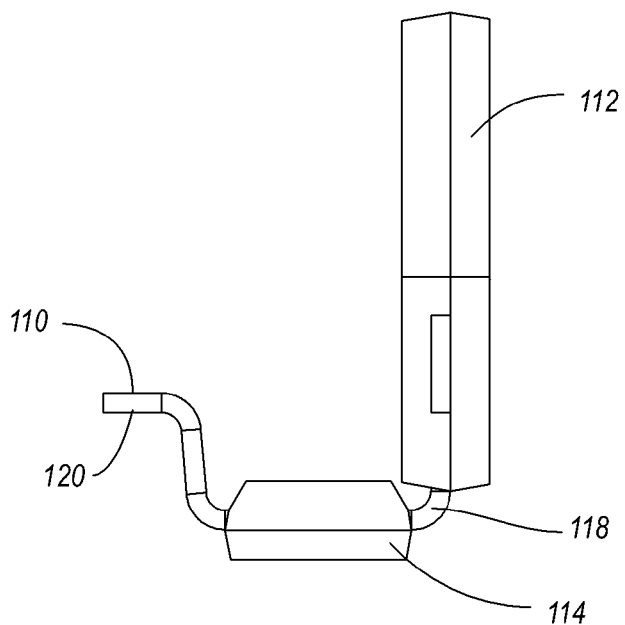
FIG. 4D illustrates a side view of the assembled lead frame connector of FIG. 4B.

FIGS. 4A and 4B illustrate a ROSA 100 and a corresponding lead frame connector 102 that can be constructed according to an alternate exemplary embodiment of the present invention. FIG. 4A shows the ROSA 100 and the lead frame connector 102 prior to assembly. FIG. 4B shows the two pieces assembled in one exemplary operational configuration. One advantage of this exemplary embodiment is that the lead frame connector 102 can be manipulated into its operational configuration as part of the assembly process after the process used to dispose the conductors or leads within the casing, rather than during or as part of the process to dispose the conductors or leads within the casing.

As with the ROSA 10 of FIG. 1A, the ROSA 100 has five leads 104, extending from one end 106. Lead frame connector 102 has five corresponding electrical contacts 108 at respective first ends 109 of conductors or leads 110. The electrical contacts 108 can be aligned with the leads 104 of the ROSA 100. Lead frame connector 102 can include a first casing 112 and a second casing 114 that each can support a portion of conductors 110. As illustrated, the first ends 109 of the five conductors 110 are contained within the first casing 112. A second end 120 of the conductors 110 extends through the second casing 114. In alternate embodiments, the electrical contacts 108 can be held in a fixed position by first casing 112 without being entirely contained therein.

In one exemplary use of the lead frame 102, the ends 120 of the five conductors 110 extending from second casing 114 act or function as contact points that are sized and configured to be connected to, for example, a PCB. One advantage of this version of the lead frame connector 102 is that the casing 112 and the casing 114 can be coplanar during the manufacturing process. The two casings 112, 114 and the conductors 110 can be generally aligned in parallel planes, optionally co-planar, during the manufacturing process, and the second casing 114 orientated relative to the first casing 112 during the assembly process. The five conductors 110 can then be manipulated or bent to the desired configuration at a location between the first casing 112 and the second casing 114 and/or at a location adjacent to the second casing 114, as part of the assembly process. This will be discussed in more detail below.

FIGS. 5A and 5B illustrate a TOSA 130 and a corresponding lead frame connector 132 that can be constructed according to an alternate embodiment the present invention. FIG. 5A shows TOSA 130 and the lead frame connector 132 prior to assembly. FIG. 5B shows the two pieces assembled in one exemplary operational configuration. One advantage of this exemplary embodiment is that the lead frame connector 132 can be formed into its operational configuration as part of the assembly process after the process used to dispose the conductors or leads within the casing, in a similar process to that discussed with respect to the ROSA 100.

As with TOSA 20 of FIG. 1B, TOSA 130 has four leads 134, extending from one end 136. Lead frame connector 132 has four corresponding electrical contacts 138 at a first end 139 of conductors 140. The electrical contacts 138 can be aligned with the leads 134 of the TOSA 130. Lead frame connector 132 can include a first casing 142 and a second casing 144 that each can support a portion of conductors 140. As illustrated, the first ends 139 of the four conductors 140 are contained within the first casing 142. In alternate embodiments, the electrical contacts 138 can be held in a fixed position by first casing 142 without being entirely contained therein. A second end 150 of the conductors 140 extends through the second casing 144.

In one exemplary use of the lead frame 132, the ends 150 of the four conductors 140 are sized and configured to be connected to, for example, a PCB. As with the lead frame connector 102, the two casings 142, 144 and the conductors 140 are generally aligned in parallel planes during the manufacturing process. In some embodiments, they can be coplanar. The four conductors 140 and the casing 144 can then be manipulated until second end 150 is in a desired location. As shown, the conductors 140 are bent at a location between the first casing 142 and the second casing 144 as part of the assembly process. This will be discussed in more detail below.

The lead frame connectors 102 and 132 of FIGS. 4A and 5A yield desirable electrical performance and RF response. These results can be achieved because of the ability to control impedances. The width and shape of the conductors 110 of the lead frame connector 102 and conductors 140 of the lead frame connector 132, and the gaps between conductors 110, 140, can be carefully controlled. The impedances can be controlled by adjusting the shape, position, and dimensions of the conductors 110, 140 in the lead frame connectors 102, 132, based on the electrical and RF conditions that are to be experienced in any particular application. Prior to beginning the manufacturing process for the lead frame connectors 102 and 132, computer simulations of various designs can be performed to identify those that generate acceptable RF responses.

In exemplary embodiments, the first and second casings 112, 114 of the lead frame connector 102, and the first and second casings 142, 144 of the lead frame connector 132 can be fabricated using an injection molding process, a transfer molding process, or other molding processes known to those of skill in the art. The casings 112, 114, 142 and 144 can generally be made from a polymer, synthetic material, or other material capable of functioning as a dielectric or insulator. Various types of plastics, such as, but not limited to, Liquid Crystal Polymers (LCP) and Polyetherimide (PEI), can be used in this application. One example of an LCP is Vectra® manufactured by Ticona Engineering Polymers. One example of a PEI is Ultem® PEI resin from General Electric (GE) Plastics. In general, any polymer that has sufficient mechanical strength to withstand the bending process can be used. In some embodiments, it can be desirable to use a material having a minimum of an Underwriter's Laboratories (UL) 94V0 flammability rating. In yet other embodiments, it can be desirable to utilize materials that meet the Reduction of Hazardous Substances (ROHS) Directive 2002/95/EC of the European Union, which is incorporated herein by reference in its entirety. Among other things, the ROHS Directive eliminates the use of halogenic fire retardants and the use of several heavy metals, such as lead and cadmium, in order to preserve the environment. The LCP material discussed above exhibits both of these desirable properties.

The plastic material used to mold the lead frame connectors 102 and 132 can be selected to have an appropriate dielectric constant as determined by the simulation process discussed below. Alternately, the dielectric constant can be used as an input to the simulation process. The electrical performance of the lead frame connectors 102 and 132 is particularly important for relatively high frequency transceiver modules, such as those that operate at 1, 2, 4, or as much as 10 Gbit/s or higher. The lead frame connectors of the invention can be used with any of these modules while exhibiting acceptable RF responses. Some specific aspects of the design of the lead frame connector useful in achieving a desired electrical performance, and to meet other performance criteria, are discussed below.

In order to successfully design a lead frame connector that connects an optical subassembly to a printed circuit board, various factors can be taken into account. These factors can sometimes be broken down into factors that mostly affect the physical design and factors that mostly affect the electrical design. Physical design factors can include the layout of the lead frame connector, how the connector connects to both the OSA and the printed circuit board, and how well the end product stands up to normal handling, etc. Electrical design factors can include selecting material for the leads, determining the exact dimensions of the leads based on a desired frequency range in which the finished assembly will operate, determining the size and spacing of the circuits on the PCB, etc.

One method for creating a design that balances all of the factors discussed above is to use different software to model the physical and electrical factors. For example, in one embodiment, SolidWorks 3D Product Design software from SolidWorks Corporation can be used to model the physical parts used in the lead frame connector, the OSA, and the PCB. While simple electrical circuits can be modeled using well known techniques, calculating the performance of more complex 3D shapes requires a sophisticated 3D EM field solver. In one embodiment, High Frequency Simulation Software, such as HFSS™ from Ansoft Corporation, can be used to model the more complex electrical properties of the lead frame connector, the OSA and the PCB. It is understood that a single piece of software could also be used that allows for both changes in the physical structure and changes in the electrical structure to be simulated without the need for different software packages.

In one embodiment of the method, the physical characteristics are modeled using SolidWorks, and this model is exported into the HFSS program. The specific design elements that affect the electrical characteristics are then modeled using HFSS. Any changes indicated by specific test results can be implemented using the appropriate software. For example, if physical changes need to be made to the lead frame design to more easily allow for the connections that need to be made, these changes can be made in SolidWorks and imported back into HFSS. Likewise, changes to the specific components that affect the electrical performance can be made directly in HFSS, and new simulations run to determine the effect of the changes.

In the embodiments disclosed herein, the above process can be used, by way of example and not limitation, to determine the width, spacing and cross-sectional thickness of the leads, the width, spacing and thickness of the pads on the PCB that the lead frame connects to, and the spacing and/or location of some of the components and/or other structures on the PCB. In some embodiments, the lead frame 132 for the TOSA 130 can be designed to utilize a 25 ohm single end impedance, or a 50 ohm differential impedance. Alternately, the lead frame 102 of the ROSA 100 can be designed to utilize a 50 ohm single end impedance, or a 100 ohm differential impedance. The differential impedance provides for two signals that are 180° out of phase. Since the signals are transmitted along proximate paths, the phase shift helps to mitigate or even eliminate the potential cross talk and interference between the signals.

In still other embodiments, and using the processes described above, it can be determined that the leads in both lead frame connectors 102, 132 can have a metal thickness of approximately 0.2 mm, a width of approximately 0.5 mm, and a separation distance of approximately 0.3 mm. Depending on the materials used for the leads and the casing, and further depending on the specific frequency that the lead frame/optical sub-assembly combination is designed for, different dimensions are also possible and fall within the scope of the embodiments discussed herein. The dimensions cited above are provided strictly as an example of one possible set of dimensions for the leads.

In keeping with the ROHS standard mentioned above, some particular materials can be selected and tested to ensure acceptable electrical and RF performance for the lead frame connectors, and for the modules as a whole. In one embodiment, the leads can be made from a copper-iron alloy (C194-Spring Hard) which is commonly used in semiconductor package lead frames. This material can be selected for, among other things, it's excellent mechanical properties and platability. For example, the material can be sufficiently flexible to allow for the thermal expansion and contraction that occurs within a module without affecting the electrical properties of the lead frame. Additionally, this flexibility allows for the mechanical connection of the lead frames to the optical sub-assemblies and PCB without inducing unwanted stress in the components. By making the pads on the PCB somewhat larger than the actual leads to be connected, the physical placement of the leads on the PCB can be adjusted to allow for mechanical alignment of the OSA, the lead frame and the PCB without sacrificing electrical performance. Those skilled in the art will realize that a wide variety of other metals and/or metal alloys can also be used in the lead frames of the present invention.

In one embodiment, the stamped lead frames can be plated with successive layers of nickel, palladium, and gold prior to undergoing the plastic molding process. This plating system has excellent solderability and can be selected because it is lead free (a ROHS requirement) and does not exhibit the tin whisker problems associated with pure tin plating systems. Other plating materials can also be used.

2. Lead Frame Connector Fabrication Process

One of the advantages of the exemplary embodiments of the lead frame connectors of the present invention is that they can be manufactured at a much lower cost than conventional flex circuits that have been used in optical transceiver modules. In addition to the lead frame connectors themselves, the embodiments of the invention also extend to methods of manufacturing the lead frame connectors.

According to one embodiment, one exemplary method of manufacturing the lead frame connectors 12 and 22 is performed using a reel-to-reel insert injection molding process. Reel-to-reel insert injection molding processes are known generally in the art, but have not previously been applied to the manufacture of connectors that can be used to connect optical sub-assemblies to printed circuit boards of optical transceiver modules.

This exemplary process of manufacturing lead frame connectors 12 and 22 can include a step of stamping the appropriate conductor structure and configuration in a ribbon of conductive material. For example, the general conductor configuration 18 shown in FIGS. 2B and 3B can be formed by stamping a copper ribbon. The conductor configuration can be easily selected to conform to the conductor design that has been determined to have acceptable electrical performance as described above.

The stamped ribbon can be spooled from one reel to another while being passed through the insert injection molding process. During this exemplary process, the conductors of the stamped ribbon are bent or manipulated as needed in three dimensions as shown, for example, in FIGS. 2B and 3B, to achieve the necessary three-dimensional conductor configuration. The insert injection molding process can then form the casing about the lead frame, which provides mechanical support and electrical isolation for the conductors. While reel to reel processing is the lowest cost process, it requires more complex tooling and is typically only used for very high volume applications. Smaller volumes can be made in individual strips containing one or more lead frames that are then loaded into the molding machine. Similarly, stamping is another high volume process, but the lead frame conductors can also be etched using a photochemical technique in lower volumes. The choice of a particular manufacturing process can be driven by the optimum tradeoff between tooling cost, part cost, and volume without significantly changing the design of the part.

After the casing 32 is formed, the lead frame assembly can be passed through a singulation die that dices the ribbon having the molded casings into individual lead frame assemblies. During the preceding insert injection molding process, the individual conductors in the lead frame can be held together using a portion of the lead frame. In general, lead frame manufacturing processes use a portion of the lead frame structure to mechanically stabilize the individual conductors during the stamping and molding process. Conventional lead frame manufacturing processes typically use external stabilization, meaning that the individual conductors are typically stabilized and connected to an external support structure that is sheared off during the singulation stage. One problem associated with stabilization and singulation in this manner is that conductive stubs often remain in electrical contact with the leads after this step. Sizeable stubs can act as antennas and degrade the RF response of the lead frame structure.

According to one exemplary embodiment of the invention, relatively large stubs are avoided by using an internal stabilizer illustrated in FIGS. 2B, 2D, 3B and 3D, by reference numeral 40. The stabilizer 40 can be generally similar for both TOSA and ROSA connectors 12 and 22, and the details are discussed herein in reference to the ROSA connector 12 of FIGS. 2B and 2D. In particular, the five individual conductors of FIG. 2B are connected centrally one to another with a "starburst" conductive stabilizer or structure 40 in a way that provides mechanical stabilization during the molding process. This stabilizer 40 is in contrast to external stabilization structures that have typically been used in lead frame molding processes. After the molding process is complete, the conductive stabilizer 40 can be removed such as by punching, etc. through a central, or isolating, hole 42 shown in FIG. 2D. This punching operation removes most of the conductive material that had stabilized the conductors and serves to electrically separate the conductors one from another. This operation also leaves only negligible stubs that do not significantly degrade the RF response, even at high frequencies, such as 1, 2, 4 or 10 Gbits/second or higher.

An alternate exemplary embodiment of a method to manufacture lead frame connectors 102 and 132 can be discussed with respect to FIGS. 4C, 4D, 5C, and 5D. As with the prior method, the steps for making lead frame connector 102 for ROSA 100 are essentially the same as the steps for making lead frame connector 132 for TOSA 130. The following discussion will be directed to the formation of lead frame connector 102. However, it is understood that similar steps can be taken with respect to lead frame connector 132.

The method for forming lead frame connector 102 can include a step of stamping the appropriate conductor structure and configuration in a ribbon of conductive material. For example, the general conductor configuration for conductors 110 shown in FIG. 4C can be formed by stamping a copper ribbon. The conductor configuration can be easily selected to conform to the conductor design that has been determined to have acceptable electrical performance as described above. The conductors are then separated into individual conductors 110.

In this exemplary method, individual conductors 110 can be held by an external stabilization device (not shown) at the second end 120. In some exemplary embodiments, additional alignment pins 111 can be used to stabilize conductors 110 prior to the injection molding process. Since the molding process produces two individual casings 112, 114, in one exemplary embodiment the additional alignment pins 111 can be placed in between the casings at a point 118 of FIG. 4A. Point 118 then becomes the bending point in a successive step.

Figure 7A:
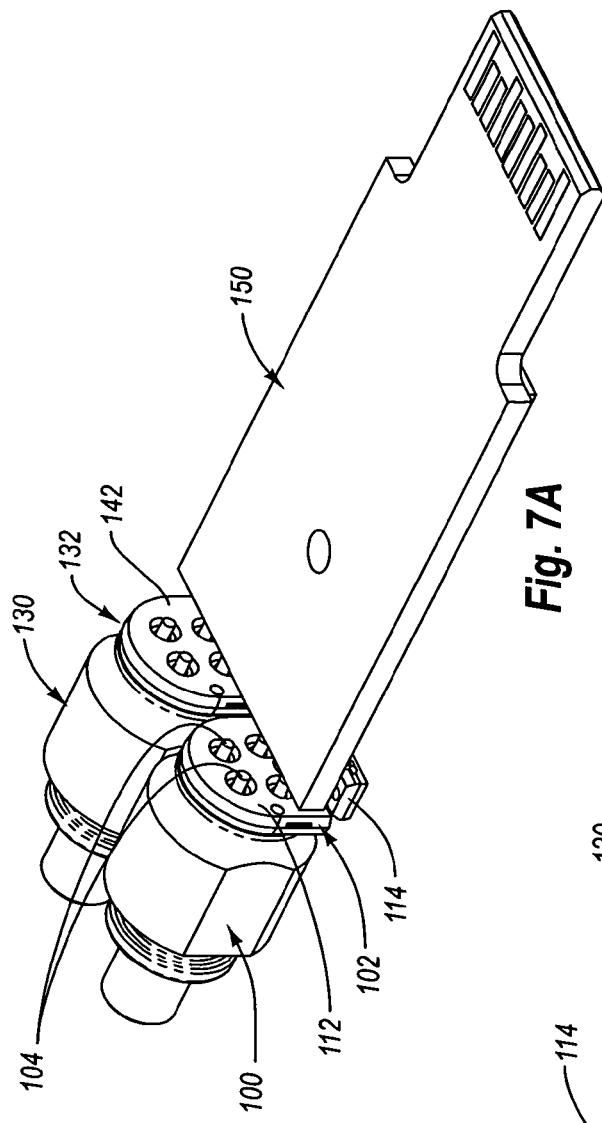
FIGS. 7A and 7B are perspective views of opposite sides of a printed circuit board that has the lead frame connectors of FIGS. 3 and 4 attached thereto.

Once the conductors 110 are stabilized, both casings 112, 114 can be injection molded using a plastic having the appropriate dielectric constant. The ends 120 of conductors 110 can then be bent to any desired angle to create the contact points that can engage pads 152 on PCB 150 (FIG. 7A). As shown in FIG. 4, in one exemplary embodiment, the second ends 120 are given two 90° bends in opposite directions to form the contact points at the second end 120. Depending on the specific application, other angles are also possible. In alternate embodiments, the second ends, 120 of conductors 110 can be bent prior to the molding process.

This exemplary embodiment of the method of the present invention discussed above with reference to FIGS. 3 and 4 also has many of the advantages over prior systems described above with reference to FIGS. 1 and 2. However, this exemplary embodiment has a some additional advantages as well. Since the first and second casings can be coplanar during manufacture, it is much easier to manufacture the tooling needed to produce the injection molded part. Additionally, the punch out step can be eliminated, thus saving additional manufacturing costs. Finally, the lead frame connectors 102, 132 can be held at their ends, thus making it easier to grip the connectors during the manufacturing process. No external tabs, projections, or stubs are required, nor do such tabs, projections or stubs need to be removed as part of the assembly process. Additionally, the flattened configuration provides unobstructed access to the solder joints when attaching the lead frame to the OSA.

3. Transceiver Manufacturing Process Using Lead Frame Connectors

FIGS. 6A and 6B illustrate opposite sides of a printed circuit board 50 that has the lead frame connectors 12 and 22 attached thereto. Exemplary embodiments of the invention disclosed herein also extend to methods of manufacturing or assembling optical transceiver modules using the lead frame connectors 12 and 22. According to one embodiment, the method of manufacturing a transceiver module includes a step of connecting the lead frames 12 and 22 to the corresponding optical sub-assemblies 10 and 20. As the process can be substantially the same for the ROSA and the TOSA, the processing of only ROSA 10 is described in detail below.

The ROSA lead frame connector 12 can be aligned with the leads 14 that protrude from the back end of the ROSA. The leads 14 can pass through corresponding holes 44 in the ROSA lead frame connector 12 and leads 14 can be soldered to the conductors of lead frame assembly 12. Passing leads 14 through holes 44 in the corresponding electrical contacts 16 can result in substantial self-alignment of lead frame connector 12 with optical sub-assembly 10. As shown in FIG. 1A, leads 14 of ROSA 10 can be conveniently accessed from the opposite side 46 of lead frame connector 12 to facilitate this soldering process. Once the soldering has been performed, the combined ROSA 10 and lead frame connector 12 becomes a surface mount device that can then be mounted to the PCB 50.

The process of surface mounting the combined ROSA 10 and lead frame connector 12 to PCB 50 can be performed in any of a variety of ways. As shown in FIG. 6B, lead frame connector 12 can have an array of leads 18 that are bent in a way that allows them to contact a corresponding array of pads 52 on PCB 50. As the leads 18 of the lead frame connector 12 are placed in contact with pads 52, the physical connection can be made by hand soldering, by reflow of a solder paste formed on the PCB 50, by a hot bar process, or by any other suitable technique. Another option can be to use a fixture that facilitates the process of placing the lead frame connector 12 in contact with PCB 50 and soldering it thereto.

It is noted that, according to certain embodiments of the invention, the process of connecting the combined ROSA 10 and lead frame connector 12 to PCB 50 does not require epoxy reinforcement and avoids alignment handling issues that have been experienced in conventional methods of connecting optical sub-assemblies to PCBs using, for instance, flex circuits.

Figure 7B:
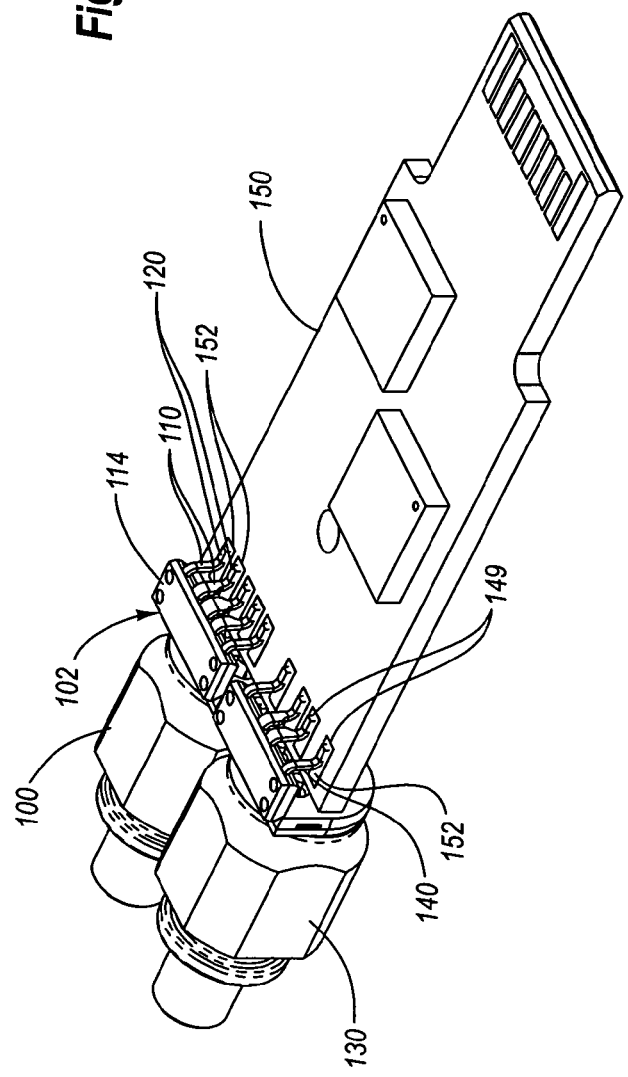

FIGS. 7A and 7B illustrate opposite sides of a printed circuit board 150 that has lead frame connectors 102 and 132 attached thereto. According to this alternate exemplary embodiment of the present invention, the method of manufacturing a transceiver module can include a step of connecting lead frames 102 and 132 to the corresponding optical sub-assemblies 100 and 130. As this process can be substantially the same for the ROSA and the TOSA of this embodiment as described above with reference to FIGS. 6A and 6B, the discussion of the specific steps involved in attaching lead frame connectors 102, 132 to ROSA 100 and TOSA 130 will not be repeated here.

The process of surface mounting the combined ROSA 100 and the lead frame connector 102 to PCB 150 can be performed in any of a variety of ways. In one exemplary embodiment, the second casing 114 can be bent at a point 118 to any desired angle to allow the contact points of the second end 120 to be easily connected to PCB 150. In the exemplary embodiment shown in FIGS. 7A and 7B, the second casing 114 is bent at approximately a 90° angle. As shown in FIG. 7B, the lead frame connector 102 has a plurality of conductors 110 that are bent in a way that allows the contact points to contact a respective corresponding array of pads 152 on PCB 150. As the contact points of lead frame connector 102 are placed in contact with pads 152, the physical connection can be made by hand soldering, by reflow of a solder paste formed on PCB 150, by a hot bar process, or by any other suitable technique. Another option is to use a fixture that facilitates the process of placing the lead frame connector in contact with PCB 150 and soldering it thereto.

In an alternate embodiment, the lead frame connector 102, 132 can be connected to the OSA while in a straight, flat configuration. The lead frame connector 102, 132 can then be bent to the appropriate angle, and the contact points of the leads can then be connected to the pads 152 on the PCB 150. In some embodiments, the pads 152 can be slightly enlarged on the PCB 150 to allow for some degree of shifting in the alignment of the lead frame to the PCB. This mechanical alignment allows the OSA/lead frame/PCB package to be fixed in the housing (not shown) such that a ferrule that contains an optical fiber that will connect to the transceiver module can be correctly aligned.

It is noted that, according to certain embodiments of the invention, the process of connecting the combined ROSA 100 and lead frame connector 102 to PCB 150 does not require epoxy reinforcement and avoids alignment handling issues that have been experienced in conventional methods of connecting optical sub-assemblies to PCBs using, for instance, flex circuits.

The present invention may be embodied in other specific forms without departing from its spirit or essential characteristics. The described embodiments are to be considered in all respects only as illustrative and not restrictive.

What is claimed is:

1. A method of manufacturing lead frame connectors, the method comprising:

stamping a selected configuration of conductors in a conductive ribbon;

securing each of said conductors in a fixed position with respect to each other; and molding a casing, having a first part separated from a second part, about said conductors such that each of said conductors forms:

an electrical contact restrained in a fixed position with respect to the first part;

a non-encased point between said first part and said second part; and a contact point extending from the second part and away from the non-encased point, wherein each of said first and second casing parts is substantially coplanar with respect to each other during said molding.

2. The method as defined in claim 1, further comprising bending said conductors.

3. The method as defined in claim 2, wherein said bending comprises bending said conductors at said non-encased point.

4. The method as defined in claim 2, wherein said bending comprises bending at least one of said conductors proximate said contact point.

5. The method as defined in claim 4, wherein said bending comprises putting multiple bends in at least one of said conductors proximate said contact point.

6. The method as defined in claim 1, wherein said securing further comprises holding said conductors proximate an end of each of said conductors.

7. The method as defined in claim 6, wherein said first part isolates each of said electrical contacts.

8. The method as defined in claim 6, wherein said securing further comprises providing a spacer between each of said conductors.

9. The method as defined in claim 8, wherein said spacers are located between said first part and said second part.

10. The method as defined in claim 1, wherein said bending comprises bending each of said conductors at first and second locations proximate said contact point and at a third location proximate said non-encased point.

11. The method as defined in claim 10, wherein said bending comprises bending each of said conductors at said first location in a first direction and at said second location in a second direction opposite said first direction.

12. The method as defined in claim 1, wherein each of said conductors is substantially planar during said molding.

13. The method as defined in claim 12, wherein each of said planar conductors is substantially coplanar with respect to a plane of said coplanar first and second casing parts during said molding.

14. The method as defined in claim 1, wherein said first part and said second part are coplanar.

* * * * *

UNITED STATES PATENT AND TRADEMARK OFFICE
CERTIFICATE OF CORRECTION

PATENT NO.        : 7,503,112 B2
APPLICATION NO.   : 11/066030
DATED             : March 17, 2009
INVENTOR(S)       : Ice et al.

Figure 3A:
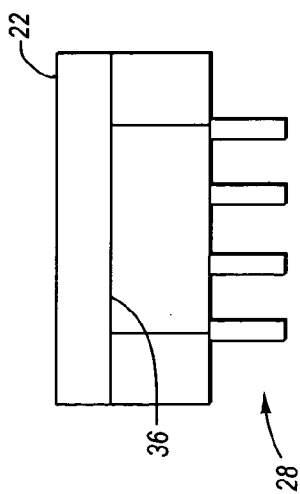
FIG. 3A illustrates a top view of the TOSA lead frame connector of FIG. 1B.
Figure 3B:
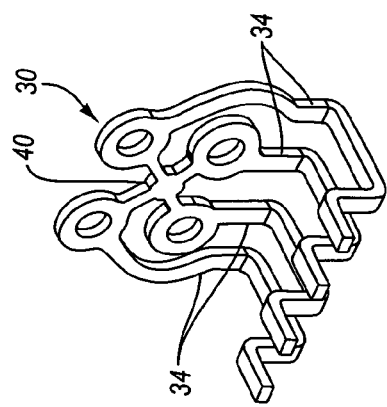
FIG. 3B illustrates a perspective view of the conductive leads in the lead frame of FIG. 1B.
Figure 3C:
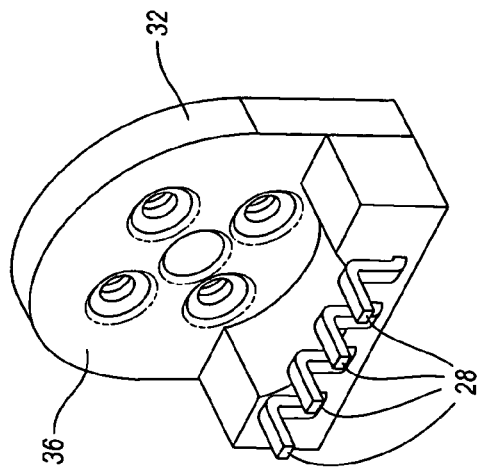
FIGS. 3C-3F illustrates various views of the TOSA lead frame connector of FIG. 1B.
Figure 3D:
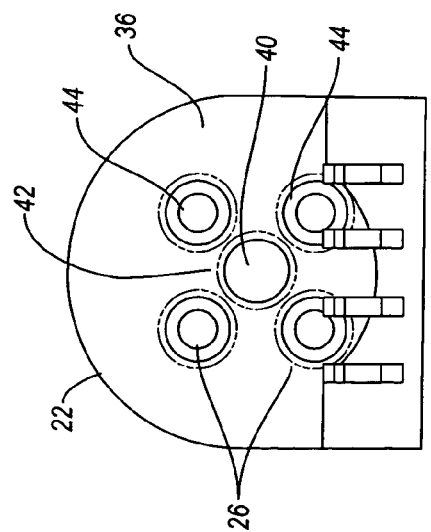
Figure 3E:
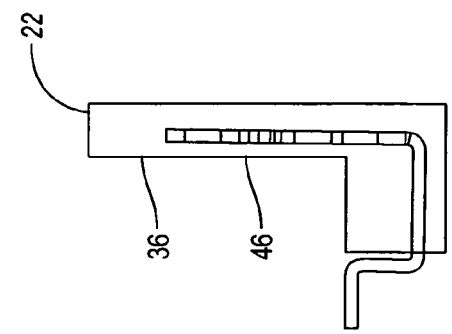
Figure 3F:
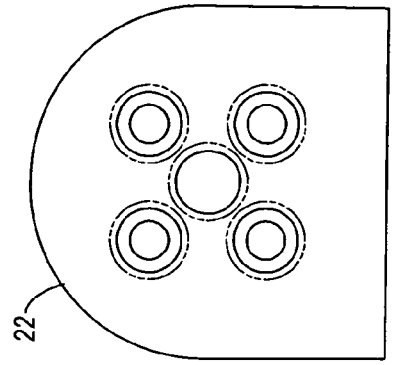

It is certified that error appears in the above-identified patent and that said Letters Patent is hereby corrected as shown below:

Drawings
Sheet 3, replace Figure 3B with the figure depicted below, wherein the reference numbers "34" have been changed to --28--

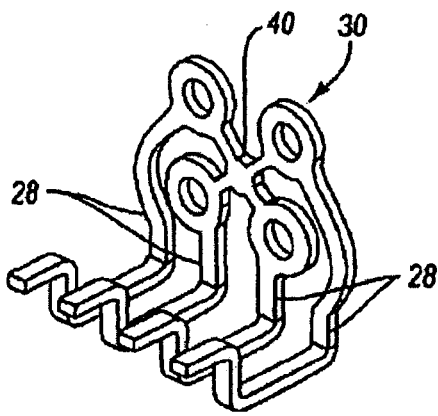

Fig. 3B

Figure 5C:
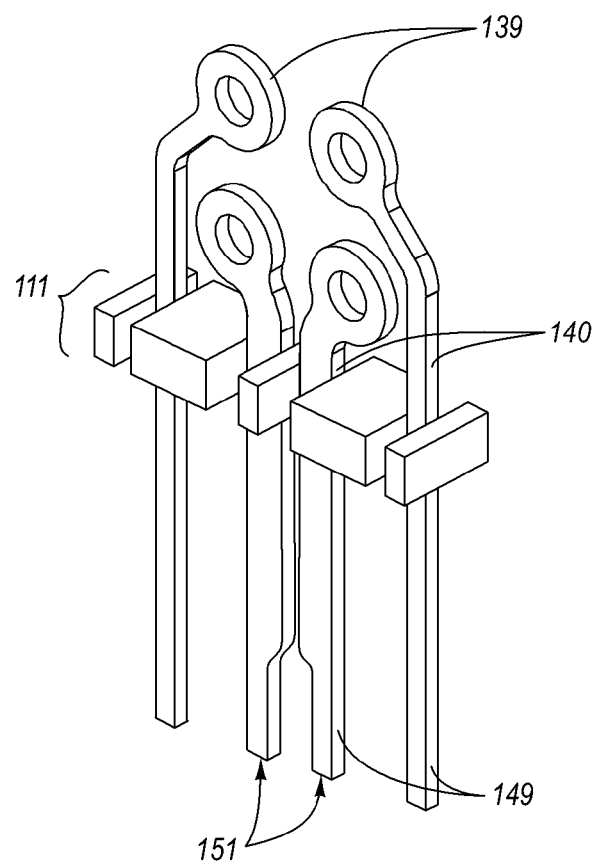
FIG. 5C illustrates a perspective view of the conductive leads in the lead frame of FIGS. 5A and 5B in an unbent configuration prior to molding.

Sheet 7, replace Figure 5C with the figure depicted below, wherein the reference number "151" has been changed to --150--

Signed and Sealed this
First Day of March, 2011

David J. Kappos
*Director of the United States Patent and Trademark Office*

CERTIFICATE OF CORRECTION (continued)
U.S. Pat. No. 7,503,112 B2

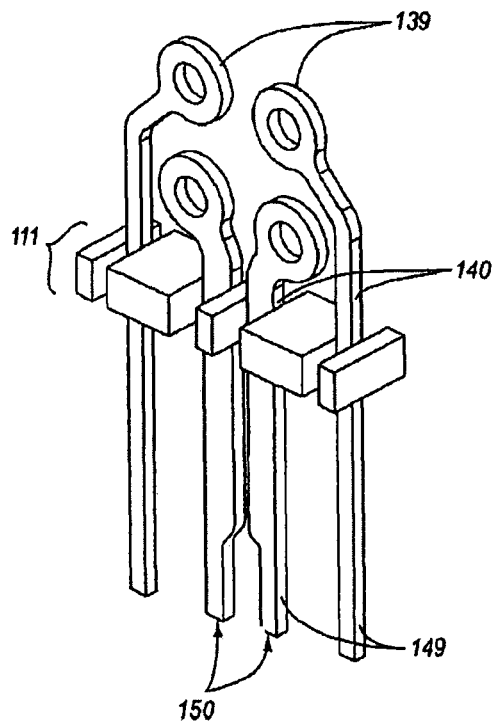

Fig. 5C

Figure 5D:
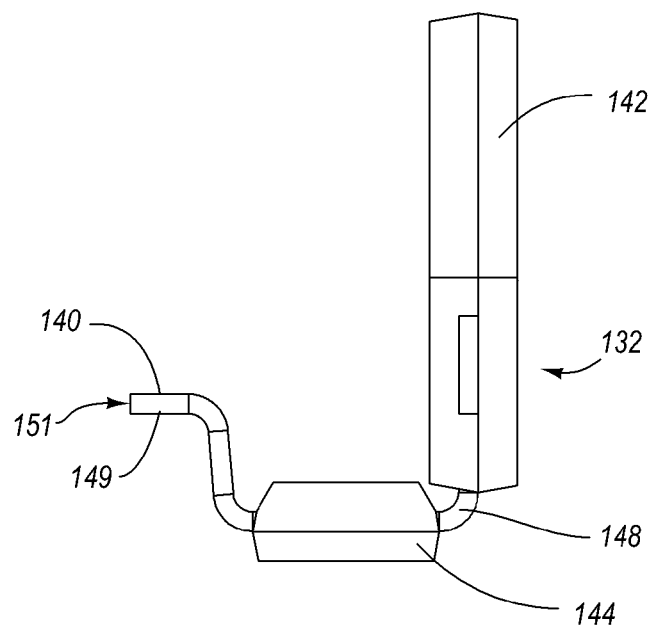
FIG. 5D illustrates a side view of the assembled lead frame connector of FIG. 5B.

Sheet 7, replace Figure 5D with the figure depicted below, wherein the reference number "151" has been changed to --150--

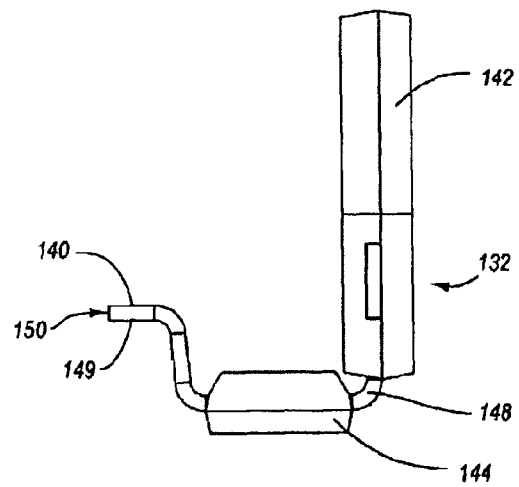

Fig. 5D

Sheet 9, replace Figure 7B with the figure depicted below, wherein the reference number "149" has been chaneed to --152--

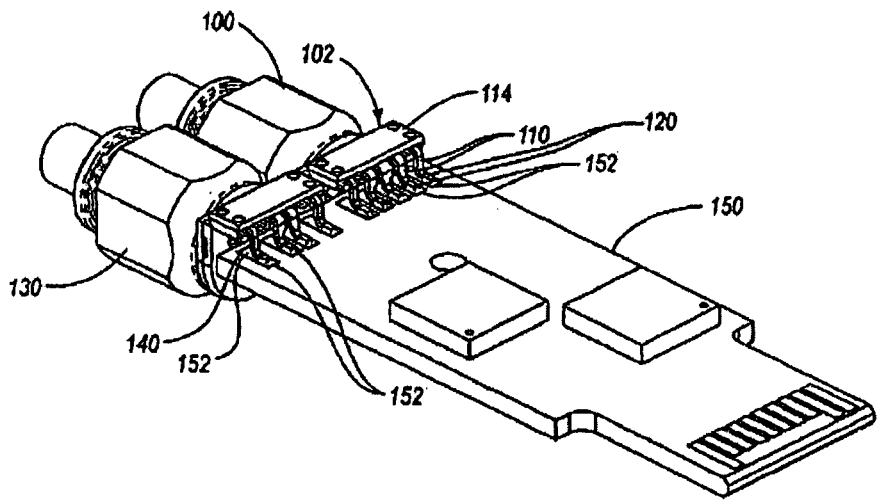

Fig. 7B

Column 2
Line 62, remove [an]

Column 3
Line 41, change "illustrates perspective view" to --illustrates a perspective view--
Line 54, change "illustrates" to --illustrate--

Column 5
Lines 1-2, change "four and five" to --five and four--
Line 48, change "casing" to --lead frame connectors--

Column 6
Line 56, change "lead frame 132" to --lead frame connector 132--

Column 8
Line 40, change "lead frame 132" to --lead frame connector 132--

Column 9
Lines 45-46, change "configuration 18" to --configurations 18 and 28--

Column 11
Line 9, change "FIG. 7A" to --FIG. 7B--
Line 20, remove [a]